(12) United States Patent
Rambaran

(10) Patent No.: US 12,738,964 B2
(45) Date of Patent: Sep. 15, 2026

(54) RADIO FREQUENCY RECEIVER

(71) Applicant: BAE SYSTEMS Information and Electronic Systems Integration Inc., Nashua, NH (US)

(72) Inventor: Rishi Rambaran, Huntington Station, NY (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 219 days.

(21) Appl. No.: 18/828,709

(22) Filed: Sep. 9, 2024

(65) Prior Publication Data

US 2026/0074728 A1 Mar. 12, 2026

(51) Int. Cl.
*H04B 1/12* (2006.01)
*H03G 3/30* (2006.01)

(52) U.S. Cl.
CPC .......... *H04B 1/123* (2013.01); *H03G 3/3036* (2013.01)

(58) Field of Classification Search
CPC . H04B 1/123; H04B 1/06; H04B 1/16; H04B 1/38; H04B 10/564; H03G 3/3036; H03G 3/30
See application file for complete search history.

(56) References Cited

U.S. PATENT DOCUMENTS 4,811,423 A 3/1989 Eastmond
6,516,185 B1 2/2003 Macnally
7,265,626 B2 9/2007 Teo
7,605,660 B1 10/2009 Kobayashi
8,030,998 B2 10/2011 Corman
8,693,700 B2 4/2014 Bakalos
8,768,178 B2 7/2014 Khatana
2021/0359657 A1* 11/2021 Cosentino ............. H03D 3/009

FOREIGN PATENT DOCUMENTS

CN 1071519 C 9/2001
CN 100521672 C 7/2009
CN 100539405 C 9/2009
EP 1512237 B1 3/2005
JP 2010258858 A 11/2010
MX 9705769 A 10/1997

* cited by examiner

*Primary Examiner* — Keith Ferguson
(74) *Attorney, Agent, or Firm* — Maine Cernota & Curran

(57) ABSTRACT

Disclosed is a radio frequency receiver with real-time dynamic gain control that uses a feed-forward structure to enable the short response times that are required by IFF systems. In the radio frequency receiver, a signal that is received by an antenna is split by a splitter, and during processing of one branch of the split by a receiver chain, the other branch is subjected concurrently to power detection, to thereby set the attenuation of a dynamic gain amplifier prior to the processed radio frequency signal arriving at the attenuator, thereby conditioning the radio frequency signal to match the dynamic range of a subsequent analog device, such as an ADC, protecting the ADC and optimizing performance thereof, while eliminating the time that would be required by a feedback-based dynamic gain control system.

14 Claims, 3 Drawing Sheets

800: Antenna
1: RF Receiver
100: Frontend
200: Splitter
210: First Split RF Signal
220: Second Split RF Signal
300: Detector
310: Detector Signal
400: Receiver Chain
500: Dynamic Gain Amplifier
600: ADC
700: FPGA

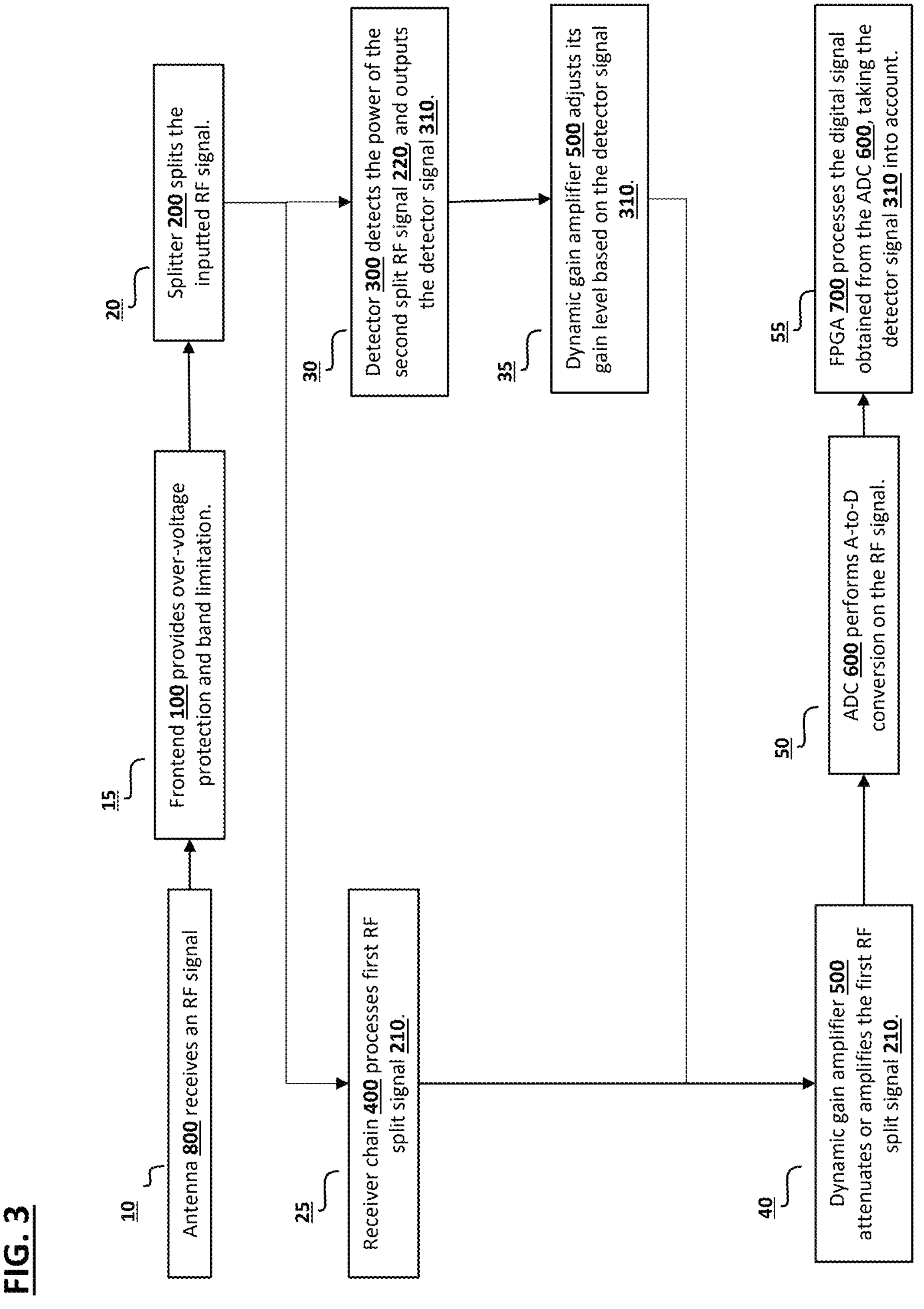
FIG. 3
10
Antenna 800 receives an RF signal
15
Frontend 100 provides over-voltage protection and band limitation.
20
Splitter 200 splits the inputted RF signal.
25
Receiver chain 400 processes first RF split signal 210.
30
Detector 300 detects the power of the second split RF signal 220, and outputs the detector signal 310.
35
Dynamic gain amplifier 500 adjusts its gain level based on the detector signal 310.
40
Dynamic gain amplifier 500 attenuates or amplifies the first RF split signal 210.
50
ADC 600 performs A-to-D conversion on the RF signal.
55
FPGA 700 processes the digital signal obtained from the ADC 600, taking the detector signal 310 into account.

RADIO FREQUENCY RECEIVER

STATEMENT OF GOVERNMENT INTEREST

This invention was made with government support under Contract No. FA8232 17 D 0027/FA8232 21 F 0286 awarded by the United States Air Force. The United States Government has certain rights in the invention.

FIELD OF THE DISCLOSURE

The following disclosure relates generally to radio frequency (RF) receiver circuits, and more specifically to RF receiver circuits configured to provide real-time protection to a downstream analog-digital converter (ADC) from an overvoltage condition and/or configured to condition an inputted RF signal to be within the input dynamic range of a downstream analog device, such as an ADC.

BACKGROUND

Modern radio frequency (RF) receiver circuits typically include analog-digital converter (ADC) circuits to enable digital handling of signals that are received. In congested electromagnetic environments, blockers (jammers) can saturate receivers and impair system functionality. Real-time protection of the ADC is crucial for achieving stabilized circuit operation, requiring adaptive input power adjustment. In addition, optimal circuit performance requires the input power to be adjusted adaptively to take advantage of the entire dynamic range afforded by the ADC or other analog circuitry. While a method for dynamically conditioning an input RF signal through a feedback mechanism has been proposed and reduced to practice, feedback mechanisms inherently involve lag times, making existing feedback-based RF signal conditioning schemes unsuitable for applications that are sensitive to turnaround time, such as in modern Identification of Friend or Foe (IFF) systems. Furthermore, existing feedback-based RF signal conditioning systems are unable to protect the ADC from overvoltage conditions, given that the ADC itself is, by definition, a requisite component of the feedback-based system.

What is needed, therefore, is a RF signal conditioning system that minimizes lag time and is able to protect an ADC from overvoltage conditions.

SUMMARY

A solution is provided herein in the form of an RF receiver that includes real-time feed-forward dynamic gain control to condition an input RF signal without exposing the ADC to a potential overvoltage condition, and without involving the time lag that is inherent to a feedback-based system.

In embodiments, the RF receiver may comprise: a frontend that includes an ESD protector and a bandpass filter; a splitter; a detector; a receiver chain; a dynamic gain amplifier; an ADC (AC/DC convertor); and an FPGA (field programmable gate array).

One embodiment provides a radio frequency (RF) receiver, comprising: an antenna that is configured to receive an input RF signal; a splitter, in operative communication with the antenna, configured to receive the input RF signal and to split said signal into a first split RF signal and a second split RF signal; a detector, in operative communication with the splitter, configured to receive the second split RF signal, to detect a power level of the second split RF signal, and to output a detector signal; a receiver chain, in operative communication with the splitter, configured to receive the first split RF signal and to perform an RF process on the first split RF signal; a dynamic gain amplifier, in operative communication with the detector and with the receiver chain, configured to receive, and to attenuate or amplify in accordance with the detector signal from the detector, the processed first split RF signal; and an analog device, in operative communication with the dynamic gain amplifier, configured to receive, and to further process, the processed first split RF signal that has been attenuated by the dynamic gain amplifier, wherein: the detector and the dynamic gain amplifier are configured jointly such that the time required for the detection of the power level of the second split RF signal and for setting and stabilization of the gain of the dynamic gain amplifier in response to the detector signal is shorter than the propagation time of the first split RF signal through the receiver chain.

In another embodiment, the dynamic gain amplifier is configured to amplify or attenuate the processed first split RF signal in accordance with the detector signal such that the power of the RF signal that is outputted from the dynamic gain amplifier is matched to a dynamic range of the analog device.

In a further embodiment, the analog device is a first analog-to-digital converter (ADC) that is configured to receive, and convert into a digital output, the processed first split RF signal that has been attenuated or amplified by the dynamic gain amplifier.

Yet another embodiment provides such an RF receiver, further comprising: a digital circuit that is configured to process a signal outputted from the first ADC.

In a yet further embodiment, the digital circuit is an FPGA.

In still another embodiment, the FPGA is configured to receive the detector signal and to use the detector signal in a calculation.

In a still further embodiment, the detector comprises a second ADC; and the detector signal comprises an analog detector signal and a digital detector signal.

In even another embodiment the dynamic gain amplifier is an attenuator (a dynamic gain amplifier wherein the gain cannot exceed one).

An even further embodiment provides a radio frequency (RF) receiving method, comprising: receiving an RF signal and splitting the RF signal into a first split RF signal and a second split RF signal; detecting a power level of the second split RF signal and outputting a detector signal based thereon; receiving the first split RF signal and performing an RF process thereon; setting a gain of a variable amplifier based on the detector signal; receiving, and attenuating or amplifying in accordance with the detector signal, the processed first split RF signal; and receiving, and further processing, the processed first split RF signal that has been attenuated by the dynamic gain amplifier, wherein: the detecting the power level of the second split RF signal and setting up the attenuation or amplification are performed such that a time required for the detection of the power level of the second split RF signal and for setting up and stabilizing the gain of a dynamic gain amplifier in response to the detector signal is shorter than a time for receiving the first split RF signal and performing the RF process thereon.

A still even another embodiment provides such a method, wherein the amplifying or attenuating of the processed first split RF signal is such that the power of the RF signal after amplifying or attenuating is matched to a dynamic range of an analog device.

A still even further embodiment provides such a method, wherein the processed first split RF signal that has been attenuated or amplified by the dynamic gain amplifier is converted from an analog signal to a digital signal.

Still yet another embodiment provides such a method, further comprising digitally processing the converted digital signal.

A still yet further embodiment provides such a method, wherein the digital processing is carried out in an FPGA.

Even yet another embodiment provides such a method, wherein a calculation is performed in the FPGA based on the detector signal.

Implementations of the techniques discussed above may include a method or process, a system or apparatus, or a kit. The details of one or more implementations are set forth in the accompanying drawings and the description below. Other features will be apparent from the description and drawings, and from the claims.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

Note that, as used herein in the specification and in the claims, references to receiving a signal, or the like, should be understood to mean receiving that signal, or the like, either directly or indirectly.

BRIEF DESCRIPTION OF THE DRAWINGS

FIG. 3 is a flowchart showing the operation of a radio frequency receiver according to an embodiment.

Figure 1:
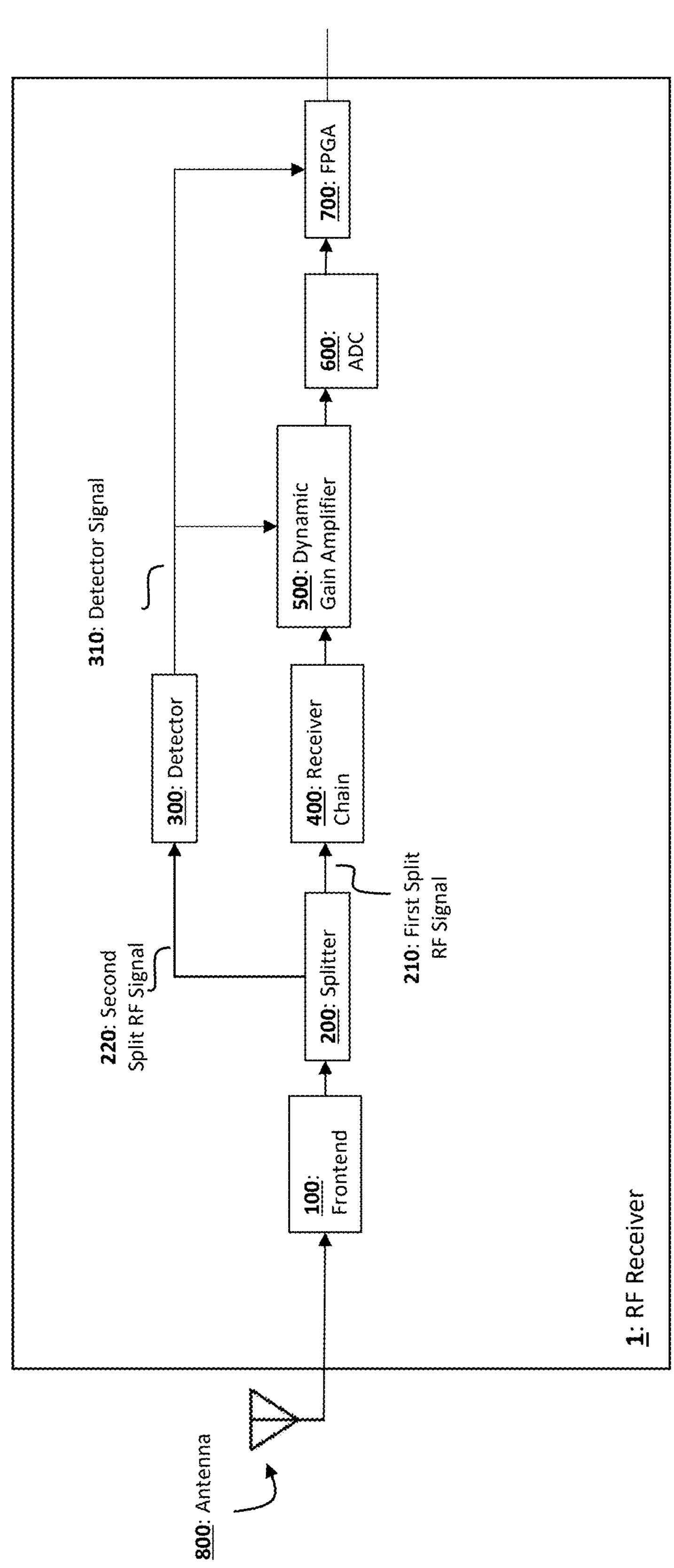
FIG. 1 is a schematic block diagram of a radio frequency receiver with real-time feed-forward dynamic gain control according to an embodiment.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

This disclosure relates to a radio frequency (RF) receiver with real-time dynamic gain control. RF receivers are used in a variety of applications, including such diverse fields as military communications, radar systems, electronic warfare, satellite communication, broadcasting, wireless networking, navigation systems (such as GPS receivers), avionics, medical devices, and remote sensing. In modern applications, most RF receivers include an analog-to-digital converter (ADC) to enable the received signal to be processed digitally. ADC circuits, by nature, have a limited dynamic range. That is, if an incoming signal that is applied to an ADC is too large (of too high a power), the signal will be clipped, with a loss of waveform data. Conversely, if the signal that is applied to the ADC is too small (of too low a power), the resultant digitized signal will lack sufficient resolution or detail, and again waveform data will be lost. In addition, incoming signals with excessively high power may cause damage to the ADC. In electronic warfare scenarios, in particular, high-power blocking signals may be generated intentionally, to intentionally damage receiver circuitry, such as a radio frequency receiver ADC. Thus, it is important to condition the input signal to match the dynamic range of the ADC, and to prevent damage to the ADC.

Circuits have been proposed, and reduced to practice, to protect ADCs from overvoltage conditions and to condition the input signal to be within the dynamic range of analog components, such as the ADC. Some such systems include power limiters, to limit the input power to a power level that is safe for the ADC. While power limiters can be effective in preventing damage from overpowered blocking signals, if power limiters are used to limit input signals to be within the dynamic range of the ADC, the power limiters, due to the inherent nonlinearity of the voltage response thereof, will clip the input signals, resulting in a loss of waveform information. Power limiters also generate harmonics, which can adversely affect downstream circuit functionality. Moreover, given the turn-on time in power limiters, there is an inherent delay in protection which manifests itself as leakage power. This leakage power can damage the ADC. As a result, there have been proposals for feedback systems to condition radio frequency (RF) input signals through the use of a variable attenuator. However, when the input power levels are high, such feedback systems inherently have substantial time lags for the feedback loops before producing useful non-clipped outputs, making them unsuitable for use in, for example, IFF (Identification of Friend or Foe) applications that require rapid responsiveness with, for example, the time from the interrogation signal being sent to receiving a response is usually within 1 to 2 milliseconds. Thus, a different approach that does not involve the delays inherent to feedback loops is required.

The present disclosure is directed toward such an RF receiver, one that eliminates the feedback delay, to thereby achieve dynamic gain control in real time, enabling use in any application, such as an IFF application, that requires rapid response.

FIG. 1 is a block diagram of a system configured in accordance with an embodiment of the present disclosure. In an embodiment, a signal received by an antenna 800 is inputted into an RF receiver 1. In embodiments this signal is inputted into a frontend 100, which may include, for example, a protection circuit and a bandpass filter, depending on the purpose for the radio frequency receiver 1. The protection circuit of embodiments is configured to prevent damage by extremely large signals, such as electrostatic discharge and blocking signals; such a configuration has substantially no impact on signals of interest that are within normal operating power ranges.

In the RF receiver 1 of embodiments, the signal that has passed through the frontend 100 is applied to a splitter 200, to split the signal into a first split RF signal 210 that is to be inputted into a receiver chain 400, and a second split RF signal 220 that is to be inputted into a detector 300. In embodiments, the splitter 200 is configured such that the first split RF signal 210 that is to be inputted into the receiver chain 400 and the second split RF signal 220 that is to be inputted into the detector 300 will be identical signals, while, in other embodiments, the splitter 200 is configured to split the power of the inputted RF signal unevenly between the two split RF signals 210 and 220 in a known proportionality ratio. In embodiments, the splitter 200 may be configured such that the power of the second split signal 220 is small enough, when compared to that of the first split signal 210, that the detector 300, described below, is protected from over-voltage malfunction and damage in the anticipated use environment.

In embodiments, the receiver chain 400 is configured to condition the input signal in accordance with the requirements of the specific application for the RF receiver 1, and may comprise, with no particular limitation, bandpass filters, amplifiers, attenuators, mixers, modulators and demodulators, and other RF circuits. Note that in both the present disclosure and in feedback-based systems some time is required for the signal to pass through the receiver chain 400; however, the time required for dynamically adjusting the amplifier/attenuator is substantially shorter than the total time required for an iterative feedback process, and thus, in embodiments, this propagation delay is compatible with even systems that require rapid responsiveness, such as IFF systems.

In embodiments, the detector 300 is configured to receive the second split RF signal 220, and thus receives an RF signal that is analogous to the signal that is received by the receiver chain 400. In embodiments, the detector 300, with a structure as described below in reference to FIG. 2, detects the power or voltage level of the second split RF signal 220, which is analogous to that of the RF signal that has passed through the frontend 100, and outputs, to a dynamic gain amplifier 500 and an FPGA 700, described below, a detector signal 310 that is in accordance with the detected power level of the inputted signal. In embodiments, the detector signal 310 that is outputted by the detector 300 may be a digital signal, while, in other embodiments, the output of the detector 300 may be an analog signal. In yet other embodiments, the detector 300 may output both digital and analog signals. In embodiments, the detector signal 310 is proportional to the amplitude of the second split RF signal 220 while, in other embodiments, the detector signal 310 is proportional to the power of the second split RF signal 220. In still other embodiments the detector signal 310 is a command signal that is proportional to neither.

In embodiments, the delay time in the detector 300 and in adjusting and stabilizing the dynamic gain amplifier 500 is shorter than the group delay time through the receiver chain 400. In embodiments a delaying element, not shown, may be added to the receiver chain 400 to ensure that the signal propagation delay through the receiver chain 400 is longer than the delay in detection by the detector 300 and stabilization of the dynamic gain amplifier 500.

The dynamic gain amplifier 500 is configured to receive the RF signal outputted by the receiver chain 400 and also to receive the detector signal 310 that is outputted from the detector 300, to attenuate or amplify the received RF signal by an amount commensurate with the signal received from the detector 300. It is stated explicitly that the term "dynamic gain amplifier 500" is not intended to limit the structure of the dynamic gain amplifier 500 to only devices capable of acting as an amplifier, but rather in embodiments the dynamic gain dynamic gain amplifier 500 may be a dynamic gain attenuator that is incapable of amplifying the signal that is applied thereto.

In embodiments, the dynamic gain amplifier 500 is configured to adjust the received RF signal to a power level that is well-suited to the dynamic range of a subsequent analog device, which, in embodiments, may be an ADC 600, such as the one described below. In embodiments, the dynamic gain amplifier 500 is controlled by an analog detector signal 310 from the detector 300 while, in other embodiments, the dynamic gain amplifier 500 is controlled by a digital detector signal 310 from the detector 300. In embodiments, the detector 300 generates and outputs, as a digital detector signal 310, a signal directly indicating an attenuation level that will cause the power level of the RF signal that is outputted by the receiver chain 400 to be well-suited to the dynamic range of the subsequent analog device, which may be the ADC 600. In embodiments, the detector signal 310 may be calculated by hardware circuitry in the detector 300 (which may comprise a portion of the FPGA 700) based on known values, such as the dynamic range of the subsequent analog device and a ratio of power levels of the split signals outputted by the splitter 200, insofar as the time constraints, described above, are satisfied, that is, insofar as the time required for generating the detector signal 310 and setting and stabilizing the dynamic gain of the dynamic gain amplifier 500 is shorter than the propagation delay through the receiver chain 400.

In embodiments, the output of the dynamic gain amplifier 500 is applied to the ADC 600 to be subjected to analog-to-digital conversion therein, producing a digital output. In other embodiments, the output of the dynamic gain amplifier 500 is applied to other analog circuitry, either instead of or in addition to the ADC 600. In embodiments, the digital output of the ADC 600 is applied to an FPGA 700 that is configured to perform postprocessing using the output of the ADC 600. In embodiments, the FPGA 700, having received the detector signal 310 that is outputted by the detector 300, is able to incorporate, into the calculations performed by the FPGA 700, the degree to which the inputted signal is attenuated or amplified by the dynamic gain amplifier 500. Note that while, for convenience in explanation, the detector 300 and the FPGA 700 are described as separate units, in embodiments a portion of the detector 300 may be configured as a portion of the FPGA 700.

Figure 2:
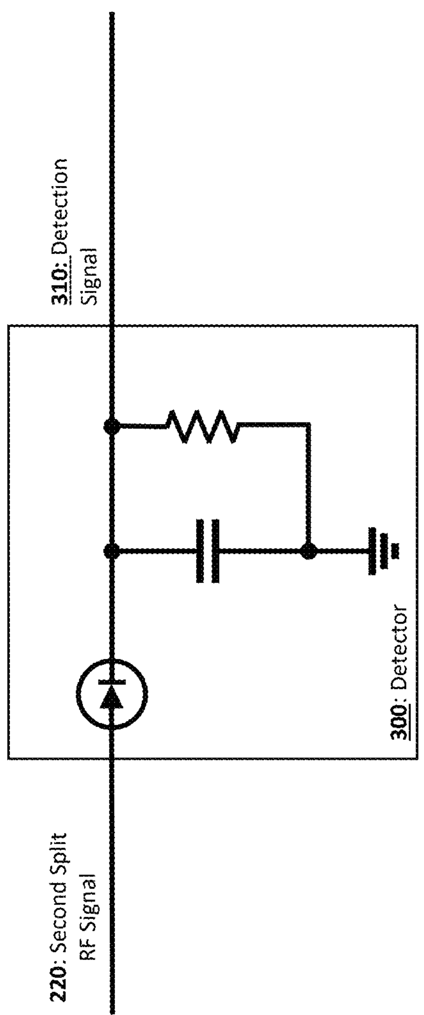
FIG. 2 is a schematic diagram showing the detail of a detector in FIG. 1 according to an embodiment.

FIG. 2 is a schematic diagram of detector 300 according to an embodiment. As depicted in FIG. 2, in embodiments wherein there are high impedances in the inputs into the dynamic gain amplifier 500 and the FPGA 700, the detector 300 may be a simple analog circuit comprising a diode, a capacitor, and a resistor, with capacitance and resistance values selected to achieve a desired circuit responsiveness, which, in embodiments, may be set according to system requirements. In embodiments, the detector 300 may comprise an ADC 350 that is configured to convert an analog detector signal 310 into a digital detector signal 310. In embodiments, the ADC 300 may comprise an FPGA, which may be part of the aforementioned FPGA 700, that is configured to generate a digital command signal that is used to control the gain of the dynamic gain amplifier 500, insofar as the timing constraints, as described above, are satisfied. In embodiments, detector 300 may be structured from discrete analog devices, as depicted in FIG. 2, or it may be structured from commercially available ICs, such as, for example, an Analog Devices ADL5902, which has an 8 ns delay time and produces an analog detector signal 310, or a Texas Instruments LMH2110, which has a 90 ns delay time and produces a digital detector signal 310. Conversely, in embodiments, the detector 300 may be structured from an FPGA that includes a built-in digital to analog converter (DAC), such as available through Xilinx, insofar as the timing constraints set forth above are satisfied.

In embodiments, the detector 300 may further comprise a voltage limiter or attenuator to protect the detector 300 from excessive voltage. It should be noted that, in embodiments, the resolution of digitization of the detector signal 310, for control of the variable gain amplifier 500 and/or for inputting into the FPGA 700 for use in correcting subsequent processing for variations in the gain of the variable gain amplifier 500, need not be as high as the resolution required in the ADC 600 or other analog circuitry that receives the output of the variable gain amplifier 500, allowing for greater attenuation of the second split RF signal 220 than would be permissible for the first split RF signal 210, thereby enabling circuit designs that provide greater protection to the detector 300 (including any ADC that may be a component of the detector 300 or that may be used to digitize the detector signal 310 for use by the FPGA 700). Note also that in embodiments wherein the detector 300 is structured from simple analog components, these components typically are able to handle greater input voltages than typical ADC circuits, and are thus less suspectable to damage from over-voltage.

FIG. 3 is a flowchart showing the operation of an RF receiver 1 in accordance with an embodiment of the present disclosure. The antenna 800 receives 10 an RF signal. In embodiments, the frontend 100 provides 15 over-voltage protection (for ESD and blocking) and band limiting. As was mentioned above, this protection is to prevent damage by extremely large signals, such as blocking signals, and has substantially no impact on signals of interest that are within normal operating power ranges. The splitter 200 splits 20 the inputted RF signal, thereby producing a first split RF signal 210 and a second split RF signal 220. Receiver chain 400 processes 25 the first split RF signal 210, where this processing may include impedance matching, filtering, providing electrostatic discharge protection, amplification, and the like, depending on the purpose for the radio frequency receiver 1.

Concurrent with the processing 25 by the receiver chain 400, the detector 300 detects 30 the power of the second split RF signal 220, and outputs the detector signal 310 to the variable gain amplifier 500 and the FPGA 700. The dynamic gain amplifier 500 adjusts its gain level based on the detector signal 310. In other embodiments, the detector signal 310 is used to calculate a command signal to set the attenuation of the dynamic gain amplifier 500. In embodiments, this calculation is based on the detected power level, a known ratio of power levels between the first split RF signal 210 and the second split RF signal 220 and on a known dynamic range of a subsequent analog device. In embodiments, the detector signal 310 is applied also to an FPGA 700 that will use the detected detector signal 310 and/or the command signal in subsequent processing within the receiver system. The first split RF signal 210, after processing 25 by the receiver chain 400, is then applied to the dynamic gain amplifier 500, which attenuates or amplifies 40 this first split RF signal 210 based on the detected power of the second split RF signal 220, causing the power of the processed and attenuated second split RF signal 220 to be within a suitable range for application to the subsequent analog device (which, in embodiments, is an ADC 600).

In embodiments, the processed and attenuated second split RF signal 220 is then subjected to analog-digital conversion 50 by an analog-digital converter (ADC) 600. Because the power level of the inputted RF signal at this point is well-suited for the ADC 600, little waveform information is lost in this analog-digital conversion 50. Furthermore, because the RF signal has been adaptively attenuated in real time, if necessary, the ADC 600 is protected from the risk of damage from an overly powerful RF signal. Conversely, because, if necessary, the RF signal has been adaptively amplified, the entire dynamic range of the ADC 600 is used, increasing the effective resolution of the analog-digital conversion.

In embodiments, the digital signal that is outputted from the ADC 600 is processed 55 by a digital device, which, in embodiments, may be an FPGA 700. In embodiments, the processing 55 by the FPGA 700 may include calculations that are based on the RF power level that has been detected by the detector 300 and indicated by the detector signal 310, making it possible to calculate characteristics of the inputted RF signal as it was prior to attenuation, for example.

Because, in the method set forth above, the detection 30 of the second RF split signal 220 and the setting of the gain of the dynamic gain amplifier 500 so as to properly attenuate or amplify 50 the RF signal are performed concurrently and in parallel with the processing of the first split RF signal 210 as it passes through the receiver chain 400, when compared to a case without attenuation or amplification, processing is delayed by only the propagation times of the RF signal passing through the splitter 200 and the dynamic gain amplifier 500, thereby eliminating time that would be required in a feedback process. This enables the RF receiver 1 of these embodiments, having feed-forward real-time gain control, to be used in applications that require short turn-around time, such as in IFF (Identification of Friend-or-Foe) applications, applications to which RF receivers that are based on feedback control are inherently ill-suited. Because in the RF receiver of embodiments, unlike the feedback-based RF receiver described above, the dynamic attenuation is applied prior to the RF signal arriving at the ADC 600, the ADC 600 is protected from damage that could be caused from a blocking signal. This enables, for example, the limit of the protecting element, unnumbered, in the frontend 100 to be increased, enabling greater flexibility in system design and a greater dynamic range for the receiver as a whole. Furthermore, because the feed-forward real-time gain control enables the RF signal that is applied to the ADC 600 to be conditioned to match the dynamic range of the ADC 600 through either attenuation or amplification, this enables the full capabilities of the ADC 600 to be used, producing greater resolution with less distortion.

Note that while in the embodiments described above, the conditioned output of the dynamic gain amplifier was applied to an ADC 600, in embodiments it may instead be applied to any of a range of other analog devices that can benefit from the power of the RF input into the analog device being conditioned, in real time, to match the dynamic range of the device.

The foregoing descriptions of the embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Note that in this disclosure, "power" of a signal is used synonymously with "voltage," unless the technical context requires a distinction be made between the concepts.

EXPLANATIONS OF REFERENCE CODES

1: RF Receiver
100: Frontend
200: Splitter
210: First Split RF Signal
220: Second Split RF Signal
300: Detector
310: Detector Signal
400: Receiver Chain

500: Dynamic Gain Amplifier
600: Analog to Digital Convertor (ADC)
700: Field Programmable Gate Array (FPGA)
800: Antenna

What is claimed is:

1. A radio frequency (RF) receiver, comprising:

a splitter configured to receive an RF signal and to split said signal into a first split RF signal and a second split RF signal;

a detector, in operative communication with the splitter, configured to receive the second split RF signal, to detect a power level of the second split RF signal, and to output a detector signal;

a receiver chain, in operative communication with the splitter, configured to receive the first split RF signal and to perform an RF process on the first split RF signal;

a dynamic gain amplifier, in operative communication with the detector and with the receiver chain, configured to receive, and to attenuate or amplify, in accordance with the detector signal from the detector, the processed first split RF signal; and an analog device, in operative communication with the dynamic gain amplifier, configured to receive, and to further process, the processed first split RF signal that has been attenuated or amplified by the dynamic gain amplifier, wherein:

the detector and the dynamic gain amplifier are configured jointly such that a time required for the detection of the power level of the second split RF signal and for setting and stabilization of the gain of the dynamic gain amplifier in response to the detector signal is shorter than the propagation time of the first split RF signal through the receiver chain.

2. The RF receiver of claim 1, wherein the dynamic gain amplifier is configured to amplify or attenuate the processed first split RF signal in accordance with the detector signal such that the power of the RF signal that is outputted from the dynamic gain amplifier is matched to a dynamic range of the analog device.

3. The RF receiver of claim 2, wherein the analog device is a first analog-to-digital converter (ADC) that is configured to receive, and convert into a digital output, the processed first split RF signal that has been attenuated or amplified by the dynamic gain amplifier.

4. The RF receiver of claim 3, further comprising a digital circuit that is configured to process a signal outputted from the first ADC.

5. The RF receiver of claim 4, wherein the digital circuit is an FPGA.

6. The RF receiver of claim 5, wherein the FPGA is configured to receive the detector signal and to use the detector signal in a calculation.

7. The RF receiver of claim 1, wherein the dynamic gain amplifier is an attenuator (a dynamic gain amplifier wherein the gain cannot exceed one).

8. The RF receiver of claim 1, wherein the detector comprises a second ADC and the detector signal comprises an analog detector signal and a digital detector signal.

9. A radio frequency (RF) receiving method, comprising:

receiving an RF signal and splitting the RF signal into a first split RF signal and a second split RF signal;

detecting a power level of the second split RF signal and outputting a detector signal based thereon;

receiving the first split RF signal and performing an RF process thereon;

setting a gain of a variable amplifier based on the detector signal;

receiving, and attenuating or amplifying in accordance with the detector signal, the processed first split RF signal; and receiving, and further processing, the processed first split RF signal that has been attenuated by the dynamic gain amplifier, wherein:

the detecting the power level of the second split RF signal and setting up the attenuation or amplification are performed such that a time required for the detection of the power level of the second split RF signal and for setting and stabilizing the gain of the dynamic gain amplifier in response to the detector signal is shorter than a time for receiving the first split RF signal and performing the RF process thereon.

10. The RF receiving method of claim 9, wherein the amplifying or attenuating of the processed first split RF signal is such that the power of the RF signal after amplifying or attenuating is matched to a dynamic range of an analog device.

11. The RF receiving method of claim 10, wherein the processed first split RF signal that has been attenuated or amplified by the dynamic gain amplifier is converted from an analog signal to a digital signal.

12. The RF receiving method of claim 11, further comprising digitally processing the converted digital signal.

13. The RF receiving method of claim 12, wherein the digital processing is carried out in an FPGA.

14. The RF receiving method of claim 13, wherein a calculation is performed in the FPGA based on the detector signal.

* * * * *